(12) United States Patent
Abdelkhalik et al.

(10) Patent No.: US 12,727,303 B2
(45) Date of Patent: Sep. 1, 2026

(54) SEMICONDUCTOR LIGHT-EMITTING DEVICE WITH NEAR-FIELD SURFACE-LATTICE-RESONANCE REFLECTOR

(71) Applicant: Lumileds LLC, San Jose, CA (US)

(72) Inventors: Mohamed S. Abdelkhalik, Eindhoven (NL); Aleksandr Vaskin, Eindhoven (NL); Debapriya Pal, Amsterdam (NL); Jaime Gomez Rivas, Eindhoven (NL); Albert Femius Koenderink, Amsterdam (NL); Toni Lopez, Aachen (DE); Aimi Abass, Aachen (DE)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 1062 days.

(21) Appl. No.: 17/880,976

(22) Filed: Aug. 4, 2022

(65) Prior Publication Data

US 2023/0049688 A1 Feb. 16, 2023

Related U.S. Application Data

(60) Provisional application No. 63/233,043, filed on Aug. 13, 2021.

(51) Int. Cl.
*H10H 20/833* (2025.01)
*H10H 20/856* (2025.01)

(52) U.S. Cl.
CPC .................................. *H10H 20/856* (2025.01)

(58) Field of Classification Search
CPC .................................................. H10H 20/833
See application file for complete search history.

(56) References Cited

U.S. PATENT DOCUMENTS 9,263,701 B2 2/2016 Hatwar et al.
9,741,912 B2 * 8/2017 Hoeppel .............. H10H 20/856
(Continued)

FOREIGN PATENT DOCUMENTS

CN 110783439 A 2/2020
KR 10-2015-0129749 A 11/2015
(Continued)

OTHER PUBLICATIONS

English Translation of Kim (Year: 2017).*
(Continued)

*Primary Examiner* — Minsun O Harvey

(57) ABSTRACT

A light-emitting device includes a semiconductor diode structure, a surface-lattice-mode (SLR) structure against the back of the diode structure, and a reflector against the back of the SLR structure. The diode structure includes first and second doped semiconductor layers and an active layer between them; the active layer emits output light at a nominal emission vacuum wavelength $\lambda_0$ to propagate within the diode structure. The SLR structure includes an index-matched layer, a lower-index layer, and scattering elements, and is in near-field proximity to the active layer relative to $\lambda_0$. At least a portion of the output light, propagating perpendicularly within the diode structure relative to a device exit surface, exits the diode structure as device output light. The scattering elements redirect output light propagating within the device, including in laterally propagating surface-lattice-resonance modes supported by the SLR structure, to propagate perpendicularly toward the device exit surface.

20 Claims, 3 Drawing Sheets

(56) References Cited

U.S. PATENT DOCUMENTS

| | | | | |
|---|---|---|---|---|
| 10,263,144 | B2 * | 4/2019 | Jorgenson | H10H 20/01 |
| 2010/0140637 | A1 | 6/2010 | Donofrio et al. | |
| 2010/0213485 | A1 * | 8/2010 | McKenzie | H10H 20/819<br>257/E33.013 |
| 2012/0018755 | A1 | 1/2012 | Speck et al. | |
| 2013/0320301 | A1 | 12/2013 | Seo et al. | |
| 2014/0008676 | A1 | 1/2014 | Wang et al. | |
| 2015/0001568 | A1 | 1/2015 | Desieres et al. | |
| 2017/0110626 | A1 | 4/2017 | Jorgenson | |
| 2019/0019921 | A1 | 1/2019 | Höppel | |
| 2021/0184081 | A1 | 6/2021 | Lopez-Julia et al. | |
| 2022/0029056 | A1 | 1/2022 | Varghese et al. | |

FOREIGN PATENT DOCUMENTS

| | | | |
|---|---|---|---|
| KR | 10731857 | B1 * | 5/2017 |
| WO | 2020/115226 | A1 | 6/2020 |

OTHER PUBLICATIONS

Zhang et al., "Improved emission of GaN-LED based on optimized multilayered lamellar micro-gratings", Journal of Luminescence, vol. 192, Jul. 17, 2017, 8 pages.

From the EPO as the International Searching Authority, Notification of Transmittal of the International Search Report and the Written Opinion of the International Searching Authority, or the Declaration, PCT/US2022/039558, Nov. 23, 2022, 13 pages.

Lu et al., "Recent Progress on GaN-based Vertical Cavity Surface Emitting Lasers", SPIE Smart Structures and Materials + Nondestuctive Evaluation and Health Monitoring, 2005, San Diego California, United States, vol. 6766, Sep. 25, 2007, 12 pages.

* cited by examiner

FIG. 1A
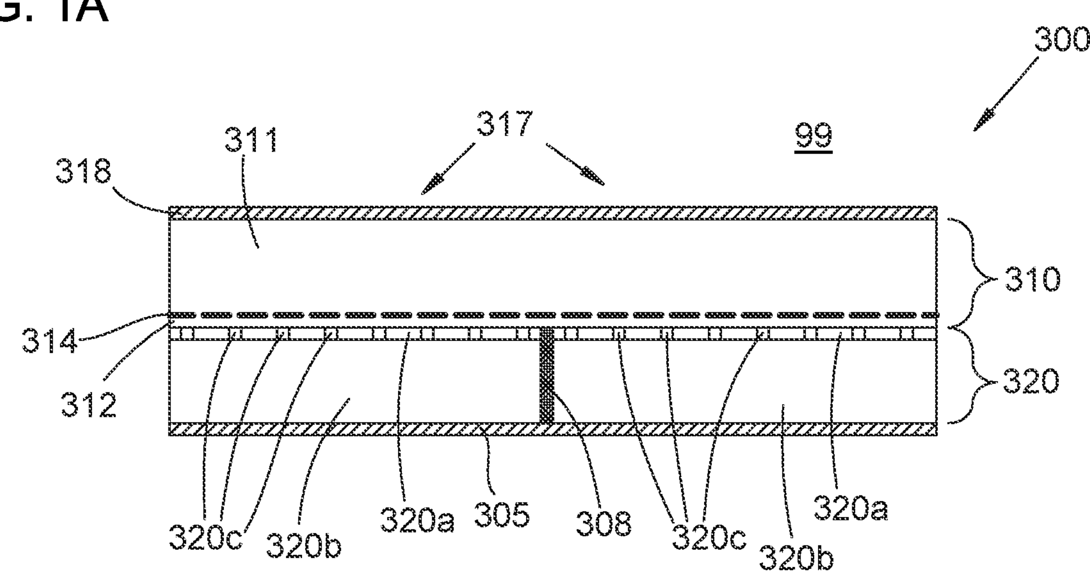
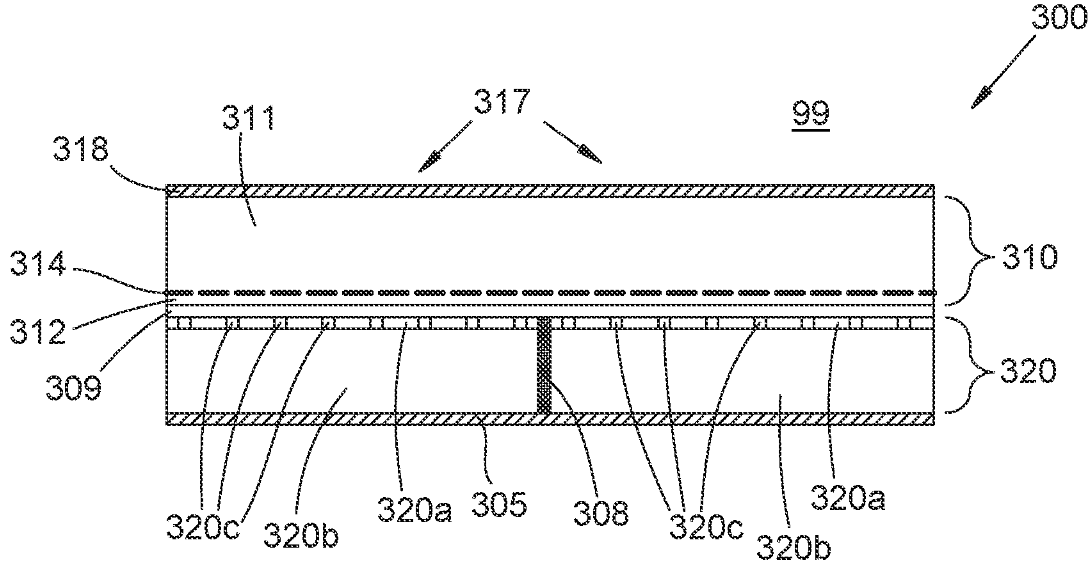
FIG. 1B

SEMICONDUCTOR LIGHT-EMITTING DEVICE WITH NEAR-FIELD SURFACE-LATTICE-RESONANCE REFLECTOR

BENEFIT CLAIM

This application claims benefit of U.S. provisional App. No. 63/233,043 entitled "Semiconductor light-emitting device with near-field surface-lattice-resonance reflector" filed Aug. 13, 2021 in the names of Abdelkhalik et al, said provisional application being hereby incorporated by reference as if set forth herein in its entirety.

FIELD OF THE INVENTION

The field of the present invention relates to semiconductor light-emitting devices. In particular, a semiconductor light-emitting device is disclosed that includes a near-field surface-lattice-resonance reflector.

SUMMARY

An inventive semiconductor light-emitting device comprises a semiconductor diode structure, a surface-lattice-resonance (SLR) structure, and a reflector. The semiconductor diode structure includes first and second doped semiconductor layers and an active layer between a back surface of the first semiconductor layer and a front surface of the second semiconductor layer. The active layer emits output light, resulting from electrical current flow through the device, at a nominal emission vacuum wavelength $\lambda_0$ to propagate within the diode structure. The SLR structure is positioned against a back surface of the second semiconductor layer, and the reflector is positioned against a back surface of the SLR structure. The second semiconductor layer is sufficiently thin so that the SLR structure is in near-field proximity to the active layer relative to the vacuum wavelength $\lambda_0$. At least a portion of a front surface of the first semiconductor layer is arranged as a device exit surface through which at least a portion of the output light, propagating perpendicularly within the diode structure relative to the device exit surface and incident on the device exit surface within the diode structure, exits the diode structure as device output light. The device exit surface can include an anti-reflection layer or coating.

The SLR structure includes (i) an index-matched layer of substantially transparent dielectric material positioned against a back surface of the second semiconductor layer and having an effective refractive index substantially equal to that of the second semiconductor layer, (ii) a lower-index layer of substantially transparent dielectric material positioned against a back surface of the index-matched layer and having an effective refractive index lower than that of the index-matched layer, and (iii) a plurality of scattering elements positioned on or in the index-matched layer. The scattering elements are arranged so that the SLR structure supports one or more SLR modes; coupling of output light to one or more of the SLR modes results in redirection of a non-zero fraction of output light propagating within the device, including laterally propagating output light, to propagate perpendicularly toward the device exit surface. Near-field proximity of the SLR structure to the active layer, and structural arrangement of the SLR structure, can result in the device exhibiting one or more of: (i) a relatively enhanced Purcell factor, (ii) a relatively increased fraction of output light propagating within a device escape cone, (iii) a relatively reduced mean total number of internal redirections and internal reflections per photon of output light before exiting the device, or (iv) a relatively enhanced photon extraction efficiency.

Objects and advantages pertaining to light-emitting devices may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 1A and 1B are a schematic cross-sectional views of two general examples of inventive light-emitting devices.

Figure 2A:
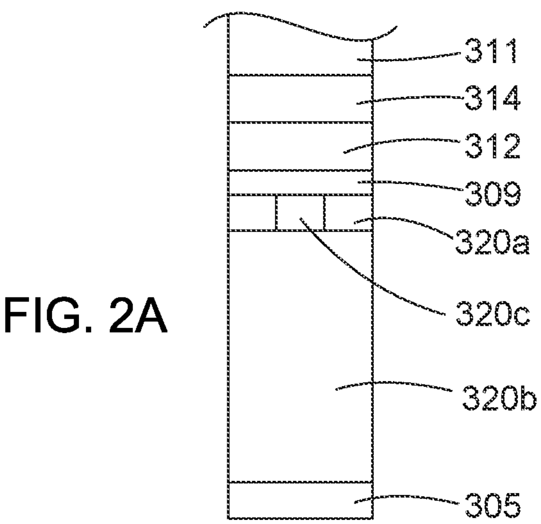
FIG. 2A is a schematic cross-sectional view of a specific example of an inventive light-emitting device.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, the light-emitting devices depicted as having a handful of scattering elements typically have hundreds or thousands of such elements per millimeter; the number of scattering elements is reduced in the drawings for clarity. In addition, the height, depth, or width of each layer or scattering element often can be exaggerated relative to those of other structures, e.g., relative to the thickness of an underlying substrate or a semiconductor layer. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the invention. The detailed description illustrates by way of example, not by way of limitation, the principles of the invention.

Typical light-emitting diodes (LEDs) include one or more light-emitting active layers within a semiconductor diode structure that emit light when driven by an electric current. The back surface of the semiconductor diode structure (and in some instances one or more or all side surfaces) typically includes a reflector that reflects light incident within the semiconductor diode structure to propagate toward the front surface of the diode structure (also referred to herein as the exit surface or escape surface). Many semiconductor materials have relatively large refractive indices (often around 3 or more) which would result in a large fraction of the emitted light being trapped within the semiconductor diode structure by total internal reflection. In some conventional light-emitting diodes texturing (e.g., corrugations, bumps or dimples, or other surface features or roughness) is formed on or attached to the front, exit surface of the semiconductor diode structure. The back-surface reflector in such so-called cavity emitters ensures that nearly all light propagating within the semiconductor diode structure eventually is incident on the front surface. The front-surface texturing serves to spoil total internal reflection at least partly, allowing a portion of the emitted light to escape the semiconductor diode structure through the front surface as device output light, while redirecting other portions propagate to within the semiconductor diode structure in directions that differ from that of a specular reflection from a flat exit surface. Those redirected portions eventually reach the front surface again and have another opportunity to escape by transmission through the front surface. This light recirculation process continues, and each so-called "photon bounce" (i.e., each round trip back and forth between the front and back surfaces through the semiconductor diode structure) within the effective "LED cavity" formed by the back-surface reflector and the front-surface texturing increases the overall probability of that photon escaping through the front surface as device output light.

Figures 3, 4, 5A, 5B:
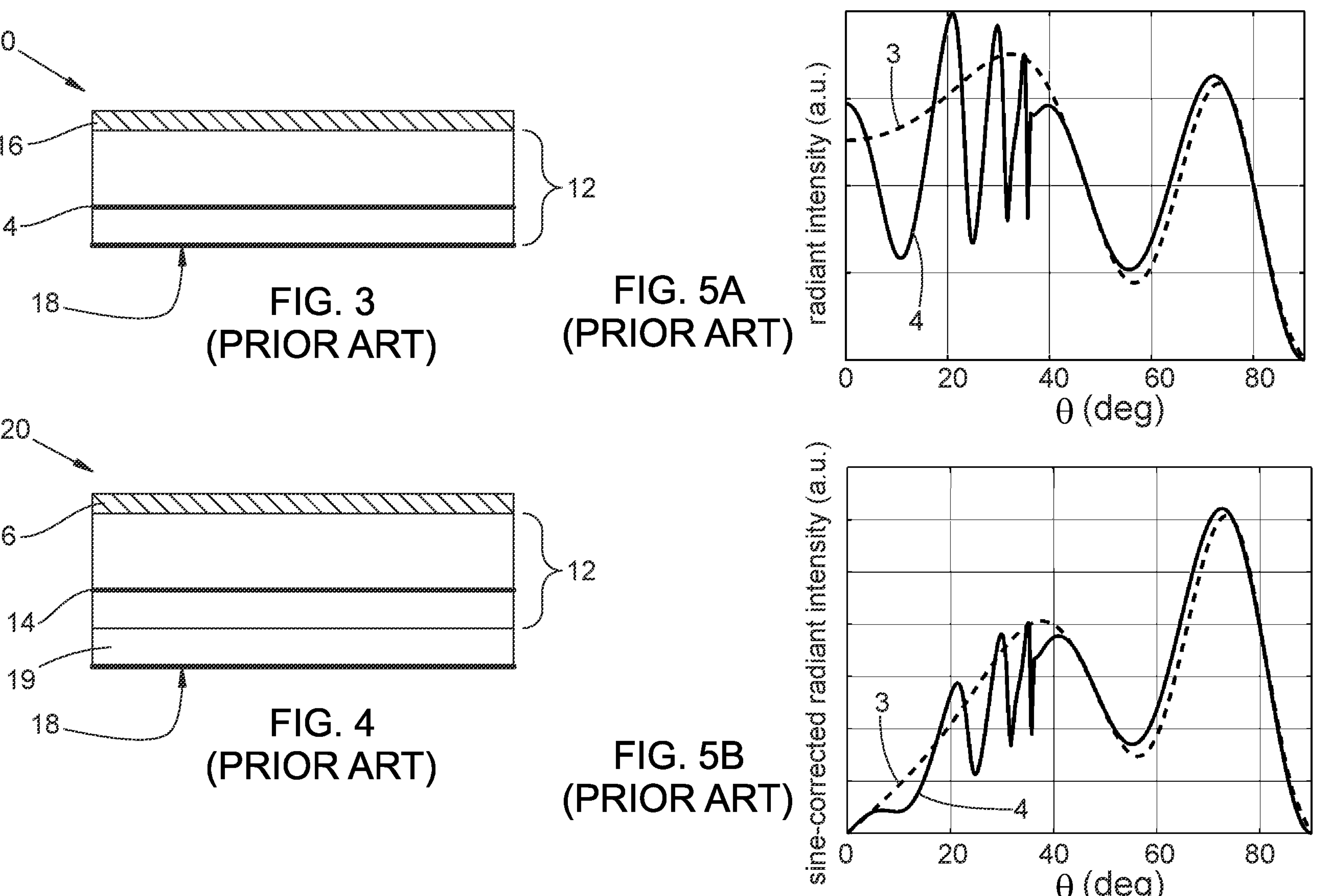
FIGS. 3 and 4 are schematic cross-sectional views of two conventional light-emitting devices.
FIGS. 5A and 5B are plots of radiant intensity (sine-corrected in FIG. 5B) as a function of emission angle for the devices of FIGS. 3 and 4.

One example of a conventional LED cavity emitter 10 is illustrated schematically in FIG. 3 and includes a semiconductor diode structure 12, a light-emitting active layer 14 within the semiconductor diode structure 12, texturing 16 on the front surface of the semiconductor diode structure 12, and a metal reflector 18 on the back surface of the semiconductor diode structure 12. Another example of a conventional LED cavity emitter 20 is illustrated schematically in FIG. 4 and includes a semiconductor diode structure 12, a light-emitting active layer 14 within the semiconductor diode structure 12, texturing 16 on the front surface of the diode structure 12, a dielectric layer 19 on the back surface of the diode structure 12, and a metal reflector 18 on the back surface of the dielectric layer 19. In both FIGS. 3 and 4 the reflector 18 exhibits only specular reflection. FIGS. 5A and 5B are plots of radiant intensity as a function of emission angle relative to the direction normal to the active layer 14 (sine-corrected in FIG. 5B, to account for integration over the full range of azimuthal angles).

In many instances the probability per bounce of a photon being transmitted through the front surface is relatively low, which in turn requires a relatively large number of round trips to achieve a sufficiently high probability of photon extraction (e.g., 10 to 50 bounces to achieve extraction efficiency approaching 90%, depending on the particular materials employed). That relatively high number of round trips or photon bounces in turn requires sufficiently low optical loss per round trip through the semiconductor diode structure (e.g., loss due to absorption by the diode structure, active layer, or reflector materials, or insufficient reflectivity of the reflector). That low-loss requirement in some cases can drive up the cost or complexity of the light-emitting device (e.g.: use of a silver reflector instead of aluminum; use of a multi-layer thin film reflector instead of a metal reflector; or use of higher-purity materials for diode structure, active layer, or reflector), or result in devices with low extraction efficiency (e.g., if low-loss alternatives are unavailable or cost-prohibitive). It is also typically the case that only a relatively small fraction (e.g., less than 13%) of light emitting by the active layer 14 is incident, upon a first encounter with the exit surface, at an angle within an escape cone, and so has a chance to be transmitted rather than internally reflected.

Devices arranged according to FIG. 3 can be "tuned" by selecting a suitable distance between the active layer 14 and the metal layer 18 that results in increased total radiated emission and a higher fraction of emitted light propagating within an escape cone (relative to a so-called semi-infinite half-cavity model, in which no structures are near enough to the active layer 14 to affect its emission characteristics). Devices arranged according to FIG. 3 also tend to have lower extraction efficiency due to unwanted absorption by the metal layer 18. That absorption can be reduced, and extraction efficiency increased, by arranging devices according to FIG. 4 to include the dielectric layer 19. However, devices arranged according to FIG. 4 tend to exhibit decrease total radiative emission and a smaller fraction of emitted light propagating within the escape cone.

For purposes of the present disclosure and appended claims, "incidence angle" and "angle of incidence" of light incident on a surface or interface refers to the angle between the propagation direction of the incident light and a vector normal to the surface or interface. Accordingly, light propagating at normal incidence with respect to a surface would have an incidence angle of 0°, while light propagating near grazing incidence with respect to that surface would have an incidence angle approaching 90°. For purposes of the present disclosure and appended claims, the "critical angle" (designated by $\Theta_C$) for light incident on a surface or interface between media of differing refractive indices refers to the incidence angle, for light propagating within the higher index medium, above which the light undergoes total internal reflection within the higher-index medium. The critical angle $\Theta_C$ therefore defines an escape cone with respect to a given surface or interface, so that light incident outside the escape cone is totally internally reflected and light incident within the escape cone can be transmitted by refraction.

For purposes of the present disclosure and appended claims, "oblique light", "oblique radiation", "obliquely propagating", "lateral light", "lateral radiation", "laterally propagating", and so forth shall refer to light propagating within a substrate, layer, or diode structure at incidence angles greater than $\Theta_C$ with respect to the front and back surfaces thereof (i.e., outside the escape cone), while "perpendicular light", "perpendicular radiation", "perpendicularly propagating", "vertical light", "vertical radiation", "vertically propagating", and so forth shall refer to light propagating within a substrate or diode structure at incidence angles less than $\Theta_C$ with respect to those surfaces (i.e., inside the escape cone), even if not literally perpendicular to the surface or vertical; "normal" shall be reserved to describe light incident at an incidence angle substantially equal to 0°.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, structure, or material described as "transparent" and "substantially transparent" shall exhibit, at the nominal emission vacuum wavelength $\lambda_0$, a level of optical transmission that is sufficiently high, or a level of optical loss (due to absorption, scattering, or other loss mechanism) that is sufficiently low, that the light-emitting device can function within operationally acceptable parameters (e.g., output power or luminance, conversion or extraction efficiency, or other figures-of-merit including those described below).

It would be desirable to provide an inventive light-emitting device that exhibits one or more of (e.g., relative to one or both of the arrangements of FIG. 3 or 4): (i) enhanced photon extraction efficiency (e.g., 80% or more), (ii) reduced number of photon bounces (e.g., 30 or fewer), (iii) enhanced total radiated emission, (iv) enhanced Purcell factor, or (v) enhanced fraction of emitted light propagating within an escape cone before first encountering an escape surface. Accordingly, an inventive semiconductor light-emitting device 300 that can achieve one or more of those improvements includes a semiconductor diode structure 310, a surface-lattice-resonance (SLR) structure 320, and a reflector 305. Two general examples of inventive devices 300 are illustrated schematically in FIGS. 1A and 1B; one specific example of an inventive device 300 is illustrated schematically in FIGS. 2A-2C.

The semiconductor diode structure 310 includes first and second doped semiconductor layers 311 and 312, respectively, and an active layer 314 between them. In many instances the first semiconductor layer 311 is an n-type semiconductor, and the second semiconductor layer 312 is a p-type semiconductor. The active layer 314 is arranged for emitting output light at a nominal emission vacuum wavelength $\lambda_0$, resulting from electrical current flow through the device 300. The emitted output light propagates within the diode structure 310. The diode structure 310 typically is arranged as a semiconductor light-emitting diode (LED). The diode structure 310 (and the layers 311/312/314) typically can include one or more doped or undoped II-VI, or Group IV semiconductor materials or alloys or mixtures thereof. Common materials employed include III-nitride materials (for emission in, e.g., the near-UV and blue portions of the optical spectrum) and III-phosphide materials (for emission in, e.g., the yellow, red, and near-IR portions of the optical spectrum); other one or more suitable materials can be employed. The active layer 314 can be arranged in any suitable way for emitting light in response to electrical current flowing through the diode structure 310. The active layer can include, e.g., one or more p-n junctions, one or more quantum wells, one or more multi-quantum wells, or one or more quantum dots. In some examples the nominal emission vacuum wavelength $\lambda_0$ can be greater than about 0.20 μm, greater than about 0.40 μm, greater than about 0.8 μm, less than about 10. μm, less than about 2.5 μm, or less than about 1.0 μm.

The surface-lattice-resonance (SLR) structure 320 is positioned against a back surface of the second semiconductor layer 312 and includes an index-matched layer 320*a*, a lower-index layer 320*b*, and scattering elements 320*c*. The index-matched layer 320*a* comprises substantially transparent dielectric material positioned against a back surface of the second semiconductor layer 312 and has an effective refractive index substantially equal to that of the second semiconductor layer 312. The lower-index layer 320*b* comprises substantially transparent dielectric material positioned against a back surface of the index-matched layer 320*a* and has an effective refractive index lower than that of the index-matched layer 320*a*. The scattering elements 320*c* are positioned on or in the index-matched layer 320*a*. The second semiconductor layer 312 is sufficiently thin so that the SLR structure 320 is in near-field proximity to the active layer 314 relative to the vacuum wavelength $\lambda_0$. In some examples the distance between the active layer 314 and the SLR structure 320 can be less than about $\lambda_0/n$, less than about $\lambda_0/2n$, less than about $\lambda_0/4n$, or less than about $\lambda_0/10n$, where n is the effective refractive index of the second semiconductor layer 312.

At least a portion of a front surface of the first semiconductor layer 311 is arranged as a device exit surface 317 in contact with an external medium 99 (e.g., ambient air or a sapphire substrate). At least a portion of the output light, that propagates perpendicularly within the diode structure 310 relative to the device exit surface 317 and is incident on the device exit surface 317 within the diode structure 310, exits the diode structure 310 as device output light. In some examples the entire front surface of the first semiconductor layer 311 can be arranged as the device exit surface 317. In other examples only a first portion of the front surface of the first semiconductor layer 311 is arranged as the device output surface 317. In such examples, a second portion of the front surface of the first semiconductor layer 311 can be arranged so as to exhibit specular or non-specular internal reflective redirection of output light incident on the front surface from within the diode structure 300; photons redirected by those portions can make another round trip through the diode structure 310.

The reflector 305 is positioned against a back surface of the lower-index layer 320*b* (i.e., so that the SLR structure 320 is between the reflector 305 and the back surface of the semiconductor layer 312). In some examples the reflector 305 can include a distributed Bragg reflector (DBR) or a dielectric multilayer reflector (MLR); in some examples the reflector 305 can include a metal layer (e.g., aluminum, silver, or gold); in some examples the reflector 305 can include both a metal layer and a DBR or MLR, with the DBR or MLR between the metal layer and the QGM structure 320. Some examples that include a metal layer (e.g., as an electrical contact, and in some instances also included in the reflector 305) can also include one or more electrically conductive vias 308. Each via 308 can be arranged as a localized, circumscribed electrical conduction path through the SLR structure 320 between the metal layer and the second semiconductor layer 312. In some examples that include vias 308, the vias 308 can connect directly to the second semiconductor layer 312 (e.g., as in FIG. 1A). In some other examples that include vias 308, the device 300 can include a substantially transparent electrode layer 309 between the SLR structure 320 and the back surface of the second semiconductor layer 312 (e.g., as in FIG. 1B); the vias 308 provide an electrical conduction path between the metal layer and the semiconductor layer 312 by being connected to the electrode layer 309, which is in direct contact with the semiconductor layer 312. The transparent electrode layer 309 can include one or more of indium tin oxide (ITO), indium zinc oxide, or one or more other transparent conductive oxides.

Any suitable dielectric materials can be employed for forming the SLR structure 310, including one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers. In some examples, the SLR structure 320 can include a niobium oxide index-matched layer 320*a* (e.g., index matched to a GaN semiconductor layer 312) and a silica lower-index layer 320*b*.

The inventive device 300 further includes a plurality of optical scattering elements 320*c* arranged on or in the index-matched layer 302*a* of the SLR structure 320 (e.g., (i)

extending from a surface of the index-matched layer 320*a* into or across the index-matched layer 320*a* (e.g., as in FIGS. 1A and 1B), (ii) extending from a surface of the index-matched layer 320*a* into the lower-index layer 320*b*, (iii) spanning an interface between the index-matched layer 320*a* and the cladding layer 320*b*, or (iv) embedded entirely within the index-matched layer 320*a*). The collective structural arrangement of the second semiconductor layer 312, the index-matched layer 320*a*, the lower-index layer 320*b*, and the scattering elements 320*c* support one or more surface-lattice-resonance (SLR) modes. Coupling of output light to one or more of the SLR modes results in redirection of a non-zero fraction of output light propagating within the device 300 to propagate perpendicularly toward the device exit surface 317. Advantageously, a fraction of laterally propagating output light emitted from the active layer 314 can be redirected via coupling to those SLR modes to propagate perpendicularly toward the device exit surface 317. Near-field proximity of the SLR structure 320 to the active layer 314, and spatial overlap of evanescent portions of SLR modes supported by the SLR structure 320 onto the active layer 314, can enhance coupling of emitted output light to one or more of the SLR modes. An additional effect of the scattering elements 320*c* is to increase the likelihood that light emitted to propagate laterally (i.e., outside the escape cone) would be redirected during a round trip through the diode structure 300 to propagate perpendicularly (i.e., within the escape cone) on a subsequent round trip, thereby increasing the probability of transmission through the exit surface 317 in a smaller median number of round trips.

In some examples the scattering elements 320*c* can include one or more volumes of dielectric material within one or more corresponding layers of the SLR structure 320; the dielectric material of each one of those scattering elements 320*c* would differ from material of the corresponding layer of the SLR structure with respect to refractive index. In some examples the scattering elements 320*c* can include one or more volumes of metallic material (e.g., aluminum, silver, or gold) within one or more corresponding layers of the SLR structure 320. In some examples the scattering elements 320*c* can include one or more nano-antennae or one or more meta-atoms or meta-molecules within one or more layers of the SLR structure 320 (e.g., as disclosed in (i) U.S. non-provisional application Ser. No. 17/121,014 entitled "Light-emitting device with internal non-specular light redirection and anti-reflective exit surface" filed Dec. 14, 2020 in the names of Antonio Lopez-Julia, Venkata Ananth Tamma, Aimi Abass, and Philipp Schneider, and (ii) U.S. provisional App. No. 63/197,648 entitled "Light-emitting device with internal non-specular light redirection and position-dependent reflection, transmission, or redirection" filed Jun. 7, 2021 in the names of Antonio Lopez-Julia, Venkata Ananth Tamma, and Aimi Abass; both of said applications are incorporated by reference as if set forth herein in their entireties). In some examples, the QGM structure 320 can include a niobium oxide index-matched layer 320*a*, a silica lower-index layer 320*b*, and aluminum scattering elements 320*c*.

In some examples, size of or spacing between scattering elements 320*c* can be less than about $\lambda_0/n$, less than about $\lambda_0/2n$, less than about $\lambda_0/4n$, or less than about $\lambda_0/10n$, n being the effective index of the second semiconductor layer 312. In some examples the scattering elements 320*c* can include one or more materials among: one or more metals or metal alloys; doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers. In some examples the scattering elements 320*c* can be arranged within one or more corresponding layers of the SLR structure 320 as a corresponding periodic array within the corresponding layer of the SLR structure 320; such an array can be of any suitable type or arrangement, e.g., a rectangular, hexagonal, or trigonal array. In other examples the scattering elements 320*c* can be arranged within one or more corresponding layers of the SLR structure 320 in an irregular or aperiodic arrangement.

Design or optimization of the diode structure 310 and SLR structure 320 can be performed (by calculation, simulation, or iterative designing/making/testing of prototypes or test devices) based on one or more selected figures-of-merit (FOMs). FOMs that are often considered can include, e.g.: (i) Purcell factor (Pf; relative spontaneous emission rate affected by environment; Pf defines the total emitted power normalized to the emission in homogeneous medium); (ii) total radiated emission (tot. rad. em. or Rad tot; the total (far-field) emitted power of the source that reaches the escape surface); (iii) radiated emission (angle) ($Rad_{CriticalAngle}$; fraction of total radiated emission restricted to a particular escape cone, e.g., 24.2° for GaN-Air or 46.8° for GaN-sapphire); or (iv) radiation efficiency (Rad eff; the ratio Rad tot/Pf; quantifies the ability for the system to radiate power into the escape surface with minimum absorption losses). Instead or in addition, reduction of cost or manufacturing complexity can be employed as an FOM in a design or optimization process. Optimization for one FOM can result in non-optimal values for one or more other FOMs. Note that a device that is not necessarily fully optimized can nevertheless provide acceptable enhancement of one or more FOMs; such partly optimized devices fall within the scope of the present disclosure or appended claims.

Inventive devices 300 arranged according to FIG. 1A or 1B can be optimized to exhibit improvement with respect to one or more of the FOMs mentioned above. It is believed that near-field proximity of the SLR structure 320 to the active layer 314, and spatial overlap of evanescent portions of SLR modes supported by the SLR structure 320 onto the active layer 314, can enhance the spontaneous emission rate, and can alter the spatial distribution of that emission to be directed more perpendicularly than emission without the SLR present. Together those effects can result in a larger fraction of emitted light propagating within a specified escape cone. The multiple layer thicknesses and size/shape/arrangement of the scattering elements 320*c* in the SLR structure 320 also provide numerous parameters that can be tuned in a given optimization process, providing opportunities for improvements relative to the conventional devices of FIGS. 3 and 4.

Figure 2B:
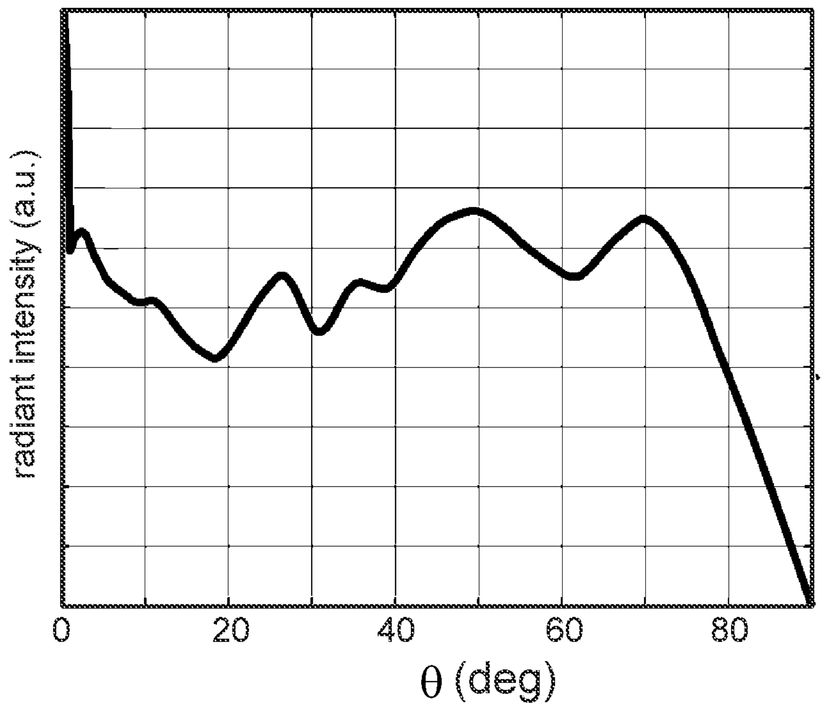
FIG. 2B is a plot of radiant intensity versus emission angle (not sine-corrected) for the device of FIG. 2A.

In the example of FIG. 2A, the diode structure 310 is a GaN LED (layers 312 and 314 are 50 nm thick), the indexed-matched layer 320*a* is niobium oxide 50 nm thick (index-matched to the GaN layer 312), the lower-index layer 320*b* is silica 450 nm thick, and the reflector 305 is a silver layer. The electrode layer 309 is ITO and is 20 nm thick. The scattering elements 320*c* are aluminum nanoantennae 50 nm high and 60 nm wide and extend entirely through the niobium oxide layer 320*a*. The scattering elements 320*c* are arranged on a 184 nm grid. A plot of angle-dependent radiant intensity (not sine-corrected) is shown in FIG. 2B for the device of FIG. 2A. The device of FIG. 2A exhibits strongly enhanced emission near zero degrees (i.e., substantially normal to the device exit surface 317), and reduced emission at other angles. That behavior can result in a relatively high fraction of emitted output light propagating within the escape cone before its first encounter with the device exit surface 317. Other arrangements and material combinations can be employed an optimized with respect to any one or more selected FOMs.

More generally, in some examples of fully or partly optimized inventive light-emitting devices 300, near-field proximity of the SLR structure 320 to the active layer 314, and structural arrangement of the SLR structure 320, can result in the device 300 exhibiting a Purcell factor that is greater than about 1.01, greater than about 1.02, greater than about 1.03, greater than about 1.04, greater than about 1.05, or even higher. More generally, in some examples of fully or partly optimized inventive light-emitting devices 300, near-field proximity of the SLR structure 320 to the active layer 314, and structural arrangement of the SLR structure 320, can result in a fraction of output light propagating within the diode structure 310 toward the front surface of the first semiconductor layer 311, within an escape cone defined by an interface between the first semiconductor layer 311 and an external medium 99 (e.g., ambient air), that is greater than about 0.13, greater than about 0.14, greater than about 0.15, greater than about 0.16, greater than about 0.17, or even higher. More generally, in some examples of fully or partly optimized inventive light-emitting devices 300, near-field proximity of the SLR structure 320 to the active layer 314, and structural arrangement of the SLR structure 320, can result in a fraction of output light propagating within the diode structure 310 toward the front surface of the first semiconductor layer 311, within an escape cone defined by an interface between the first semiconductor layer 311 and a substantially transparent solid medium 99 (e.g., silicone or sapphire), that is greater than about 0.35, greater than about 0.40, or even higher.

In some examples, one or both of the SLR structure 320 or the device exit surface 317 can be arranged so that the device 300 exhibits a mean total number of internal redirections and internal reflections per photon of output light, after being emitted by the active layer 314 and before exiting the diode structure 310 through the device exit surface 317, that is less than 30, less than 20, less than 10, or less than 5. In some examples, the light-emitting device 300 can exhibit a photon extraction efficiency that is greater than about 80.%, greater than about 90.%, or greater than about 95.%. In some examples, the SLR structure 320, or the SLR structure 320 with a metal layer 305 on its back surface, can exhibit reflectivity that is greater than about 80.%, greater than about 85.%, greater than about 90.%, or greater than about 95.%. In some examples, the SLR structure 320, or the SLR structure 320 with a metal layer 305 on its back surface, can exhibit optical loss per pass for output light incident thereon that is less than about 20.%, less than about 10.%, less than about 5.%, less than about 2.0%, or less than about 1.0%.

In some examples, arrangement of the device exit surface 317 can include an external medium 99 in direct contact with at least a portion of the front surface of the first semiconductor layer 311. In some other examples, the device exit surface 317 can include an anti-reflection layer or coating 318 so that the device exit surface 317 against the external medium 99 exhibits reduced reflectivity, for output light perpendicularly incident thereon from within the diode structure 310, relative to Fresnel reflectivity of an interface between the front surface of the first semiconductor layer 311 and the external medium 99 in the absence of the front-surface coating or layer 318. In some examples the anti-reflection layer or coating 318 can include a single-layer quarter-wave dielectric thin film or a multi-layer dielectric thin film; in some examples the anti-reflection layer or coating 318 can include an array of nano-antennae, meta-atoms, or meta-molecules; in some examples the anti-reflection layer or coating 318 can include a moth-eye structure or an index-gradient film. In some examples, reflectivity of the device exit surface 317 against the external medium 99 can be less than about 10.%, less than about 5.%, less than about 2.0%, less than about 1.0%, or less than about 0.5%. In some examples, the anti-reflection layer or coating can include one or more materials among: doped or undoped silicon oxide, nitride, or oxynitride; one or more doped or undoped metal oxides, nitrides, or oxynitrides; one or more optical glasses; or one or more doped or undoped polymers. In some examples, the external medium 99 can be substantially solid and can include one or more materials among: one or more metal or semiconductor oxides, oxynitrides, or nitrides, one or more doped or undoped silicones, or one or more doped or undoped polymers; in some other examples the external medium 99 can comprise vacuum, air, a gaseous medium, or a liquid medium.

In some examples, a method for making an inventive light-emitting device 300 can include: (A) forming the first semiconductor layer 311, the active layer 314, and the second semiconductor layer 312; (B) forming the SLR structure 320 on the back surface of the second semiconductor layer 312; and (C) forming the reflector 305 on the back surface of the SLR structure 320. In some examples, a method for making an inventive light-emitting device 300 can include: (A) forming the first semiconductor layer 311, the active layer 314, and the second semiconductor layer 312; (B) forming the SLR structure 320 on the back surface of the second semiconductor layer 312; (C) forming the reflector 305 on the back surface of the SLR structure 320; and (D) forming the anti-reflection layer or coating 318 on the device exit surface 317. Any suitable one or more material processing techniques or methodologies can be employed, including but not limited to beam or vapor deposition, lithography of any type, epitaxy, nanoimprinting, film or layer growth, and so forth.

A method for operating an inventive light-emitting device 300 can include supplying to the light-emitting device 300 electrical power so that the light-emitting device 300 emits device output light from the device exit surface 317 to propagate in an external medium 99 against the device exit surface 317.

In addition to the preceding, the following example embodiments fall within the scope of the present disclosure or appended claims:

Example 1. A semiconductor light-emitting device comprising: (a) a semiconductor diode structure including first and second doped semiconductor layers and an active layer between a back surface of the first semiconductor layer and a front surface of the second semiconductor layer, the active layer being arranged for emitting output light, resulting from electrical current flow through the device, at a nominal emission vacuum wavelength $\lambda_0$ to propagate within the diode structure; (b) a surface-lattice-resonance (SLR) structure positioned against a back surface of the second semiconductor layer, the SLR structure including (i) an index-matched layer of substantially transparent dielectric material positioned against a back surface of the second semiconductor layer and having an effective refractive index substantially equal to that of the second semiconductor layer, (ii) a lower-index layer of substantially transparent dielectric material positioned against a back surface of the index-matched layer and having an effective refractive index lower than that of the index-matched layer, and (iii) a plurality of scattering elements positioned on or in the index-matched layer, the second semiconductor layer being sufficiently thin so that the SLR structure is in near-field proximity to the active layer relative to the vacuum wavelength $\lambda_0$; and (c) a reflector on a back surface of the SLR structure so that the SLR structure is between the reflector and the back surface of the semiconductor layer, (d) at least a portion of a front surface of the first semiconductor layer being arranged as a device exit surface through which at least a portion of the output light, that propagates perpendicularly within the diode structure relative to the device exit surface and is incident on the device exit surface within the diode structure, exits the diode structure as device output light, and (e) the scattering elements being arranged so that the SLR structure supports one or more SLR modes, coupling of output light to one or more of the SLR modes resulting in redirection of a non-zero fraction of output light propagating within the device, including laterally propagating output light, to propagate perpendicularly toward the device exit surface.

Example 2. The device of Example 1, the reflector comprising a distributed Bragg reflector or a dielectric multilayer reflector.

Example 3. The device of Example 2, the distributed Bragg reflector or the dielectric multilayer reflector including one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 4. The device of any one of Examples 1 through 3, the reflector including a metal layer.

Example 5. The device of Example 4 further comprising one or more electrically conductive vias, each via being arranged as a localized, circumscribed electrical conduction path through the SLR structure between the metal layer and the second semiconductor layer.

Example 6. The device of any one of Examples 4 or 5, the metal layer including one or more of aluminum, silver, or gold.

Example 7. The device of any one of Examples 1 through 6 further comprising a substantially transparent electrode layer between the SLR structure and the back surface of the second semiconductor layer.

Example 8. The device of Example 7 further comprising multiple electrically conductive vias, each via being arranged as a localized, circumscribed electrical conduction path through the SLR structure between a metal layer and the transparent electrode layer.

Example 9. The device of any one of Examples 7 or 8, the transparent electrode layer including one or more of indium tin oxide, indium zinc oxide, or one or more other transparent conductive oxides.

Example 10. The device of any one of Examples 1 through 9, distance between the active layer and the SLR structure being less than about $\lambda_0/n$, less than about $\lambda_0/2n$, less than about $\lambda_0/4n$, or less than about $\lambda_0/10n$, n being the effective refractive index of the second semiconductor layer.

Example 11. The device of any one of Examples 1 through 10, $\lambda_0$ being greater than about 0.20 μm, greater than about 0.4 μm, greater than about 0.8 μm, less than about 10. μm, less than about 2.5 μm, or less than about 1.0 μm.

Example 12. The device of any one of Examples 1 through 11, the SLR structure including one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 13. The device of any one of Examples 1 through 12, the scattering elements including one or more volumes of dielectric material within one or more corresponding layers of the SLR structure, the dielectric material of each one of those scattering elements differing from material of the corresponding layer of the SLR structure with respect to refractive index.

Example 14. The device of any one of Examples 1 through 13, the scattering elements including one or more volumes of metallic material within one or more corresponding layers of the SLR structure.

Example 15. The device of any one of Examples 1 through 14, the scattering elements including one or more nano-antennae or one or more meta-atoms or meta-molecules within one or more layers of the SLR structure.

Example 16. The device of any one of Examples 1 through 15, size of or spacing between scattering elements being less than about $\lambda_0/n$, less than about $\lambda_0/2n$, less than about $\lambda_0/4n$, or less than about $\lambda_0/10n$, n being the effective refractive index of the second semiconductor layer.

Example 17. The device of any one of Examples 1 through 16, the scattering elements including one or more materials among: one or more metals or metal alloys; doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 18. The device of any one of Examples 1 through 17, the SLR structure including a niobium oxide index-matched layer, a silica lower-index layer, and aluminum scattering elements.

Example 19. The device of any one of Examples 1 through 18, the scattering elements being arranged on or in the index-matched layer as a periodic array.

Example 20. The device of Example 19, the periodic array being a rectangular, hexagonal, or trigonal array.

Example 21. The device of any one of Examples 1 through 20, the scattering elements being arranged on or in the index-matched layer in an irregular or aperiodic arrangement.

Example 22. The device of any one of Examples 1 through 21, near-field proximity of the SLR structure to the active layer, and structural arrangement of the SLR structure, resulting in the device exhibiting a Purcell factor that is greater than about 1.01, greater than about 1.02, greater than about 1.03, greater than about 1.04, or greater than about 1.05.

Example 23. The device of any one of Examples 1 through 22, near-field proximity of the SLR structure to the active layer, and structural arrangement of the SLR structure, resulting in a fraction of output light propagating within the diode structure toward the front surface of the first semiconductor layer, within an escape cone defined by an interface between the first semiconductor layer and an external medium against the front surface thereof, that is greater than about 0.13, greater than about 0.14, greater than about 0.15, greater than about 0.16, or greater than about 0.17.

Example 24. The device of Example 23, the external medium comprising ambient air.

Example 25. The device of any one of Examples 1 through 24, near-field proximity of the SLR structure to the active layer, and structural arrangement of the SLR structure, resulting in a fraction of output light propagating within the diode structure toward the front surface of the first semiconductor layer, within an escape cone defined by an interface between the first semiconductor layer and a substantially transparent solid medium against the front surface thereof, that is greater than about 0.35 or greater than about 0.40.

Example 26. The device of any one of Examples 1 through 25, one or both of the SLR structure or the device exit surface being arranged so that the device exhibits a mean total number of internal redirections and internal reflections per photon of output light, after being emitted by the active layer and before exiting the diode structure through the device exit surface, that is less than 30, less than 20, less than 10, or less than 5.

Example 27. The device of any one of Examples 1 through 26, the light-emitting device exhibiting a photon extraction efficiency that is greater than about 80.%, greater than about 90.%, or greater than about 95.%.

Example 28. The device of any one of Examples 1 through 27, the SLR structure, or the SLR structure with a metal layer on a back surface thereof, exhibiting reflectivity that is greater than about 80.%, greater than about 85.%, greater than about 90.%, or greater than about 95.%.

Example 29. The device of any one of Examples 1 through 28, the SLR structure, or the SLR structure with a metal layer on a back surface thereof, exhibiting optical loss per pass for output light incident thereon that is less than about 20.%, less than about 10.%, less than about 5.%, less than about 2.0%, or less than about 1.0%.

Example 30. The device of any one of Examples 1 through 29, wherein arrangement of the device exit surface includes an external medium in direct contact with at least a portion of the front surface of the first semiconductor layer.

Example 31. The device of any one of Examples 1 through 29, the device exit surface including an anti-reflection layer or coating so that the device exit surface against an external medium exhibits reflectivity for output light perpendicularly incident thereon from within the diode structure that is less than Fresnel reflectivity of an interface between the front surface of the first semiconductor layer and the external medium without the front-surface coating or layer.

Example 32. The device of Example 31, the anti-reflection layer or coating including a single-layer quarter-wave dielectric thin film or a multi-layer dielectric thin film.

Example 33. The device of Example 31, the anti-reflection layer or coating including an array of nano-antennae, meta-atoms, or meta-molecules.

Example 34. The device of Example 31, the anti-reflection layer or coating including a moth-eye structure or an index-gradient film.

Example 35. The device of any one of Examples 31 through 34, reflectivity of the device exit surface against the external medium being less than about 10.%, less than about 5.%, less than about 2.0%, less than about 1.0%, or less than about 0.5%.

Example 36. The device of any one of Examples 31 through 35, the anti-reflection layer or coating including one or more materials among: doped or undoped silicon oxide, nitride, or oxynitride; one or more doped or undoped metal oxides, nitrides, or oxynitrides; one or more optical glasses; or one or more doped or undoped polymers.

Example 37. The device of any one of Examples 31 through 36, the front surface of the diode structure being positioned against the external medium, the external medium being substantially solid and including one or more materials among: one or more metal or semiconductor oxides, oxynitrides, or nitrides, one or more doped or undoped silicones, or one or more doped or undoped polymers.

Example 38. The device of any one of Examples 31 through 36, the external medium comprising vacuum, air, a gaseous medium, or a liquid medium.

Example 39. The device of any one of Examples 1 through 38, the entire front surface of the first semiconductor layer being arranged as the device exit surface.

Example 40. The device of any one of Examples 1 through 38, only a first portion of the front surface of the first semiconductor layer being arranged as the device output surface, and a second portion of the front surface of the first semiconductor layer being arranged so as to exhibit specular or non-specular internal reflective redirection of output light incident on the front surface of the first semiconductor layer from within the diode structure.

Example 41. The device of any one of Examples 1 through 40, the semiconductor diode structure comprising a semiconductor light-emitting diode.

Example 42. The device of any one of Examples 1 through 41, the diode structure including one or more doped or undoped II-VI, or Group IV semiconductor materials or alloys or mixtures thereof.

Example 43. The device of any one of Examples 1 through 42, the active layer including one or more doped or undoped II-VI, or Group IV semiconductor materials or alloys or mixtures thereof.

Example 44. The device of any one of Examples 1 through 43, the active layer including one or more p-n junctions, one or more quantum wells, one or more multi-quantum wells, or one or more quantum dots.

Example 45. A method for making the light-emitting device of any one of Examples 1 through 44, the method comprising: (A) forming the first semiconductor layer, the active layer, and the second semiconductor layer; (B) forming the SLR structure on the back surface of the second semiconductor layer; and (C) forming the reflector on the back surface of the SLR structure.

Example 46. A method for making the light-emitting device of any one of Examples 31 through 44, the method comprising: (A) forming the first semiconductor layer, the active layer, and the second semiconductor layer; (B) forming the SLR structure on the back surface of the second semiconductor layer; (C) forming the reflector on the back surface of the SLR structure; and (D) forming the anti-reflection layer or coating on the device exit surface.

Example 47. A method for operating the light-emitting device of any one of Examples 1 through 44, the method comprising supplying to the light-emitting device electrical power so that the light-emitting device emits device output light from the device exit surface to propagate in an external medium against the device exit surface.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting device comprising:

a semiconductor diode structure including first and second doped semiconductor layers and an active layer between a back surface of the first semiconductor layer and a front surface of the second semiconductor layer, the active layer being arranged for emitting output light, resulting from electrical current flow through the device, at a nominal emission vacuum wavelength $\lambda_0$ to propagate within the diode structure;

a surface-lattice-resonance (SLR) structure positioned against a back surface of the second semiconductor layer, the SLR structure including (i) an index-matched layer of transparent dielectric material positioned against a back surface of the second semiconductor layer and having an effective refractive index equal to that of the second semiconductor layer, (ii) a lower-index layer of transparent dielectric material positioned against a back surface of the index-matched layer and having an effective refractive index lower than that of the index-matched layer, and (iii) a plurality of scattering elements positioned on or in the index-matched layer, the second semiconductor layer being sufficiently thin so that the SLR structure is in near-field proximity to the active layer relative to the vacuum wavelength $\lambda_0$; and a reflector on a back surface of the SLR structure so that the SLR structure is between the reflector and the back surface of the second semiconductor layer, at least a portion of a front surface of the first semiconductor layer being arranged as a device exit surface through which at least a portion of the output light, that propagates perpendicularly within the diode structure relative to the device exit surface and is incident on the device exit surface within the diode structure, exits the diode structure as device output light, and the scattering elements being arranged so that the SLR structure supports one or more SLR modes, coupling of output light to one or more of the SLR modes resulting in redirection of a non-zero fraction of output light propagating within the device, including laterally propagating output light, to propagate perpendicularly toward the device exit surface.

2. The device of claim 1, the reflector comprising a distributed Bragg reflector, a dielectric multilayer reflector, or a metal layer.

3. The device of claim 1 further comprising one or more electrically conductive vias, each via being arranged as a localized, circumscribed electrical conduction path through the SLR structure.

4. The device of claim 1 further comprising a transparent electrode layer between the SLR structure and the back surface of the second semiconductor layer.

5. The device of claim 1, distance between the active layer and the SLR structure being less than $\lambda_0/n$, n being the effective refractive index of the second semiconductor layer.

6. The device of claim 1, the scattering elements including one or more volumes of dielectric material within one or more corresponding layers of the SLR structure, the dielectric material of each one of those scattering elements differing from material of the corresponding layer of the SLR structure with respect to refractive index.

7. The device of claim 1, the scattering elements including one or more volumes of metallic material within one or more corresponding layers of the SLR structure.

8. The device of claim 1, the scattering elements including one or more nano-antennae or one or more meta-atoms or meta-molecules within one or more layers of the SLR structure.

9. The device of claim 1, size of or spacing between scattering elements being less than $\lambda_0/n$, n being the effective refractive index of the second semiconductor layer.

10. The device of claim 1, the scattering elements being arranged on or in the index-matched layer either (i) as a periodic array or (ii) in an irregular or aperiodic arrangement.

11. The device of claim 1, near-field proximity of the SLR structure to the active layer, and structural arrangement of the SLR structure, resulting in the device exhibiting a Purcell factor that is greater than 1.01.

12. The device of claim 1, near-field proximity of the SLR structure to the active layer, and structural arrangement of the SLR structure, resulting in a fraction of output light propagating within the diode structure toward the front surface of the first semiconductor layer, within an escape cone defined by an interface between the first semiconductor layer and an external medium of ambient air against the front surface thereof, that is greater than 0.13.

13. The device of claim 1, near-field proximity of the SLR structure to the active layer, and structural arrangement of the SLR structure, resulting in a fraction of output light propagating within the diode structure toward the front surface of the first semiconductor layer, within an escape cone defined by an interface between the first semiconductor layer and a transparent solid medium against the front surface thereof, that is greater than 0.35.

14. The device of claim 1, the light-emitting device exhibiting a photon extraction efficiency that is greater than 80%.

15. The device of claim 1, the device exit surface including an anti-reflection layer or coating so that the device exit surface against an external medium exhibits reflectivity for output light perpendicularly incident thereon from within the diode structure that is less than Fresnel reflectivity of an interface between the front surface of the first semiconductor layer and the external medium without the front-surface coating or layer.

16. A method for making the light-emitting device of claim 15, the method comprising: (A) forming the first semiconductor layer, the active layer, and the second semiconductor layer; (B) forming the SLR structure on the back surface of the second semiconductor layer; (C) forming the reflector on the back surface of the SLR structure; and (D) forming the anti-reflection layer or coating on the device exit surface.

17. The device of claim 1, the entire front surface of the first semiconductor layer being arranged as the device exit surface.

18. The device of claim 1, only a first portion of the front surface of the first semiconductor layer being arranged as the device output surface, and a second portion of the front surface of the first semiconductor layer being arranged so as to exhibit specular or non-specular internal reflective redirection of output light incident on the front surface of the first semiconductor layer from within the diode structure.

19. A method for making the light-emitting device of claim 1, the method comprising: (A) forming the first semiconductor layer, the active layer, and the second semiconductor layer; (B) forming the SLR structure on the back surface of the second semiconductor layer; and (C) forming the reflector on the back surface of the SLR structure.

20. A method for operating the light-emitting device of claim 1, the method comprising supplying to the light-emitting device electrical power so that the light-emitting device emits device output light from the device exit surface to propagate in an external medium against the device exit surface.

* * * * *